(12) United States Patent
Hustava et al.

(10) Patent No.: US 11,442,155 B2
(45) Date of Patent: Sep. 13, 2022

(54) DEVICES, SYSTEMS AND PROCESSES FOR DETECTING SATURATION OF RECEIVED ECHO SIGNALS

(71) Applicant: SEMICONDUCTOR COMPONENTS INDUSTRIES, LLC, Phoenix, AZ (US)

(72) Inventors: Marek Hustava, Bratislava (SK); Michal Navratil, Pustimer (CZ); Pavel Kostelnik, Bordovice (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 86 days.

(21) Appl. No.: 16/791,409

(22) Filed: Feb. 14, 2020

(65) Prior Publication Data

US 2021/0103042 A1 Apr. 8, 2021

Related U.S. Application Data

(60) Provisional application No. 62/909,378, filed on Oct. 2, 2019.

(51) Int. Cl.
*G01S 7/52* (2006.01)
*B60T 13/24* (2006.01)
*G01S 15/931* (2020.01)

(52) U.S. Cl.
CPC .......... *G01S 7/52004* (2013.01); *B60T 13/24* (2013.01); *G01S 7/52003* (2013.01); *G01S 15/931* (2013.01)

(58) Field of Classification Search
None
See application file for complete search history.

(56) References Cited

U.S. PATENT DOCUMENTS

| 4,074,070 A | 2/1978 | Gaus |
| 4,122,725 A | 10/1978 | Thompson |

(Continued)

FOREIGN PATENT DOCUMENTS

| DE | 20120201100 A1 | 8/2013 |
| GB | 2483337 A | 3/2012 |

OTHER PUBLICATIONS

China Application Serial No. 202022136114.2, First Notification to Make Rectification, dated Aug. 11, 2021 (Machine Translation).

(Continued)

*Primary Examiner* — Fekadeselassie Girma
(74) *Attorney, Agent, or Firm* — Brake Hughes Bellermann LLP

(57) ABSTRACT

The various embodiments of the present disclosure are directed to devices, system and processes for detecting saturation of a received signal in a PAS system. A process may include detecting, in a received signal and during a measurement interval, one or more correlated signal levels. Based on one or more results of the detecting, the process may include identifying in a correlated output signal portions of the received signal which exceed a given magnitude threshold during the measurement interval and providing the correlated output signal to an electronic control unit (ECU). A magnitude detector outputs the correlated output signal. A saturation detector determines whether the received signal is saturated during a portion of a measurement interval. When the received signal is saturated, a saturation signal is generated and provided on a delayed basis to the ECU such that it is provided substantially contemporaneously with the correlated output signal.

20 Claims, 13 Drawing Sheets

(56) References Cited

U.S. PATENT DOCUMENTS

| | | | |
|---|---|---|---|
| 4,533,795 A | 8/1985 | Baumhauer | |
| 4,543,577 A | 9/1985 | Tachibana | |
| 4,586,172 A | 4/1986 | Vernet | |
| 4,858,203 A | 8/1989 | Hansen | |
| 5,079,751 A | 1/1992 | Woodward | |
| 5,161,537 A | 11/1992 | Hashimoto | |
| 5,358,466 A | 10/1994 | Aida | |
| 5,724,313 A | 3/1998 | Burgess | |
| 6,731,569 B2 | 5/2004 | Yurchenko | |
| 7,408,448 B2 | 8/2008 | Li | |
| 8,154,955 B2 | 4/2012 | Yoshida | |
| 8,416,641 B2 | 4/2013 | Horsky et al. | |
| 8,699,299 B2 | 4/2014 | Horsky | |
| 10,179,346 B2 * | 1/2019 | Kutej | G01S 7/52004 |
| 10,418,994 B1 * | 9/2019 | Cullen | H03K 19/1776 |
| 10,966,021 B2 | 3/2021 | Koudar et al. | |
| 11,163,308 B2 * | 11/2021 | Alawieh | G05D 1/0212 |
| 2001/0012238 A1 | 8/2001 | Iwasaki | |
| 2003/0039171 A1 * | 2/2003 | Chiapetta | B62D 61/12 367/98 |
| 2003/0060094 A1 | 3/2003 | Motsenbocker | |
| 2003/0154792 A1 | 8/2003 | Katayama | |
| 2004/0090195 A1 | 5/2004 | Motsenbocker | |
| 2006/0103426 A1 | 5/2006 | Lee et al. | |
| 2008/0195284 A1 * | 8/2008 | Hammadou | G01C 3/00 701/45 |
| 2009/0009306 A1 | 1/2009 | Magane et al. | |
| 2009/0135672 A1 | 5/2009 | Matsuura et al. | |
| 2009/0196428 A1 | 8/2009 | Kim | |
| 2010/0199773 A1 | 8/2010 | Zhou | |
| 2012/0154048 A1 * | 6/2012 | Myles | H03F 3/45959 330/260 |
| 2012/0286859 A1 | 11/2012 | Libert et al. | |
| 2014/0293746 A1 | 10/2014 | Tran et al. | |
| 2014/0331772 A1 * | 11/2014 | Klotz | G01S 15/931 73/602 |
| 2015/0063073 A1 | 3/2015 | Takahata | |
| 2015/0078130 A1 | 3/2015 | Urban | |
| 2015/0243273 A1 | 8/2015 | Wu et al. | |
| 2015/0260833 A1 * | 9/2015 | Schumann | G01S 7/52004 367/13 |
| 2016/0357187 A1 * | 12/2016 | Ansari | G01S 13/862 |
| 2016/0380640 A1 | 12/2016 | Boser | |
| 2017/0074977 A1 | 3/2017 | Koudar et al. | |
| 2017/0115382 A1 * | 4/2017 | Kou | G01S 7/524 |
| 2017/0168151 A1 | 6/2017 | Kim | |
| 2017/0318390 A1 | 11/2017 | Bjork | |
| 2017/0363459 A1 | 12/2017 | Kim | |
| 2018/0095059 A1 * | 4/2018 | McQuillen | G01N 29/343 |
| 2018/0160226 A1 | 6/2018 | Hustava et al. | |
| 2019/0025415 A1 * | 1/2019 | Suchy | G01S 15/931 |
| 2019/0079173 A1 * | 3/2019 | Kutej | B06B 1/0215 |
| 2019/0212423 A1 * | 7/2019 | Hustava | G01S 15/931 |
| 2019/0377074 A1 * | 12/2019 | Sugae | G01S 7/526 |
| 2020/0153653 A1 * | 5/2020 | Hustava | H04B 15/04 |
| 2020/0200898 A1 * | 6/2020 | Hustava | G01S 15/10 |
| 2020/0400803 A1 * | 12/2020 | Suchy | B06B 1/0215 |

OTHER PUBLICATIONS

China Application Serial No. 202022136114.2, intent to Grant, dated Oct. 19, 2021.
China Application Serial No. 202022136114.2, Response to First Notification to Make Rectification, dated Sep. 26, 2021 (Machine Translation).
U.S. Appl. No. 16/719,085, Non-final Office Action, dated Aug. 11, 2021.
U.S. Appl. No. 16/719,085, Response to Non-final Office Action, dated Nov. 2021.
Hustava, Marek, "Piezoelectric Transducer Controller Having Model-Based Sideband Balancing", "U.S. Appl. No. 16/724,783", filed Dec. 23, 2019.
Hustava et al. "Detection of Noise-Induced Ultrasonic Sensor Blindness", U.S. Appl. No. 16/254,882, filed Jan. 23, 2019.
China Application Serial No. 202022136114.2, Office Action, dated Apr. 30, 2021 (Machine Translation).
China Application Serial No. 202022136114.2, Response to Office Action, dated Jul. 12, 2021 (Machine Translation).
U.S. Appl. No. 16/791,085, filed Feb. 14, 2020.
U.S. Appl. No. 16/867,298, filed May 5, 2020.
U.S. Appl. No. 16/719,085, Final Office Action, dated Nov. 29, 2021.
U.S. Appl. No. 16/719,085, Response to Final Office Action, dated Jan. 11, 2022.

* cited by examiner

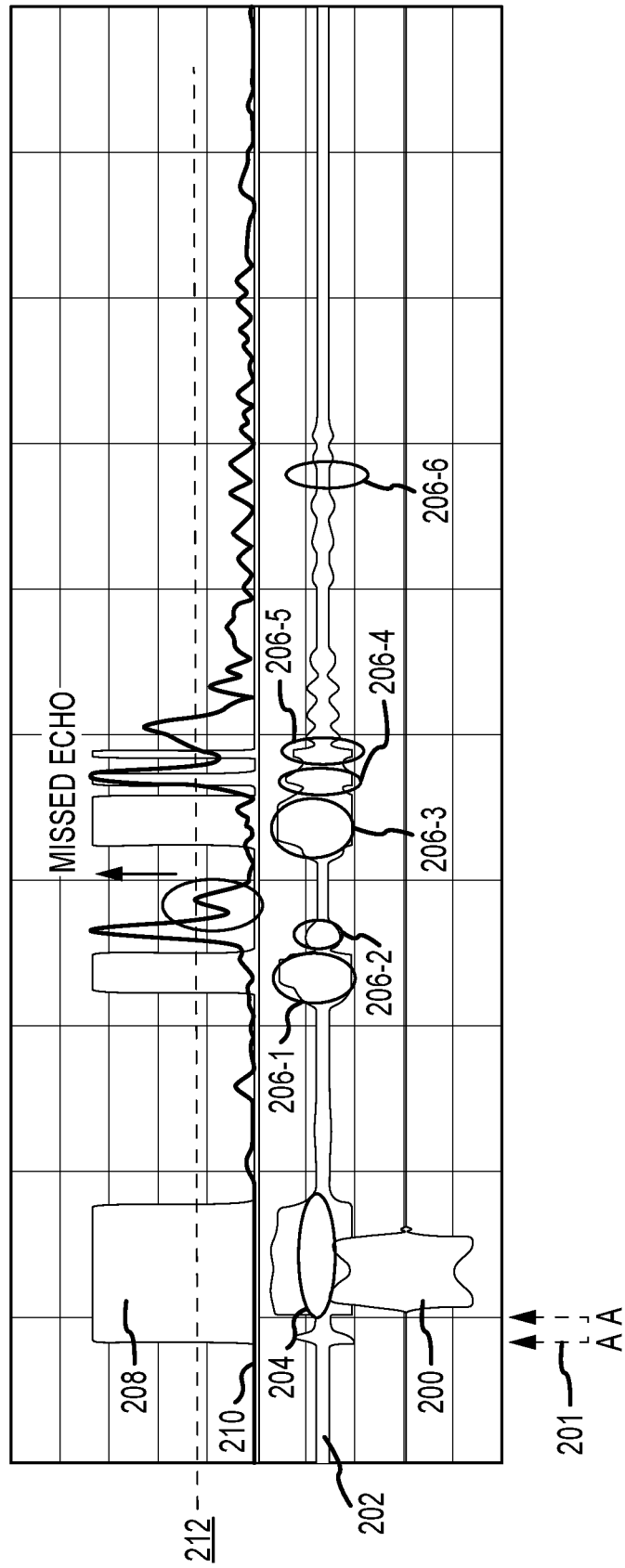

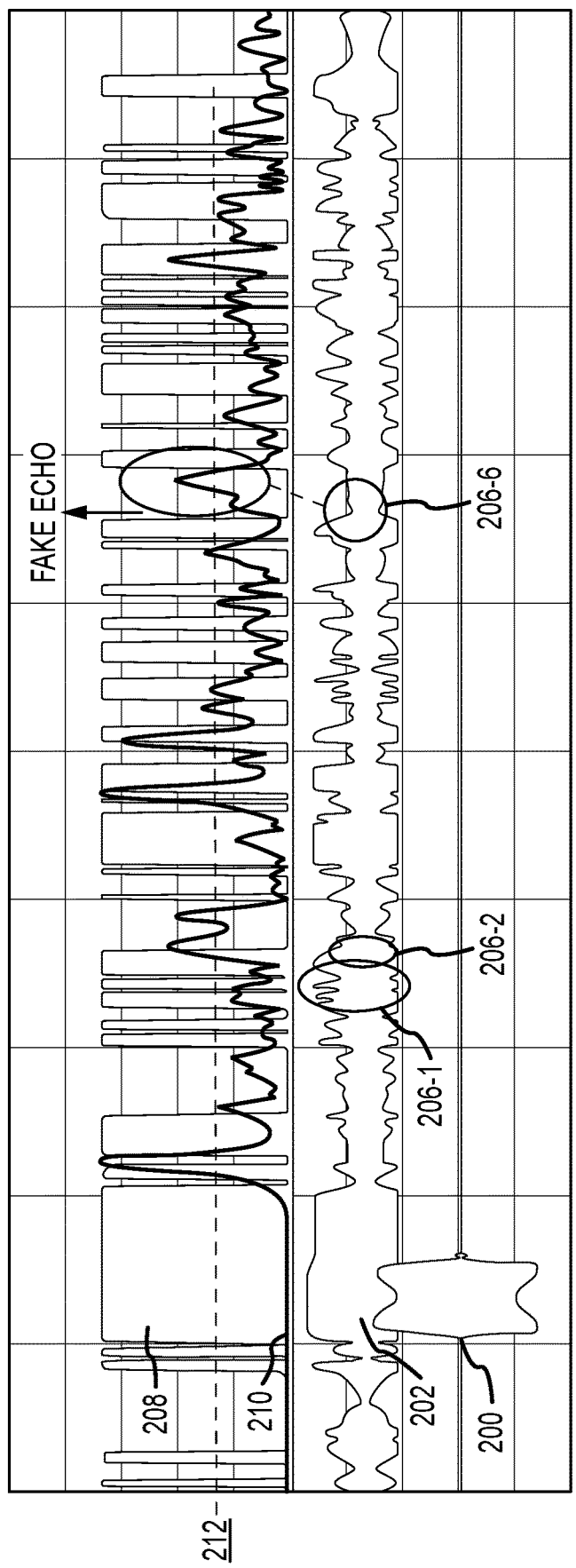

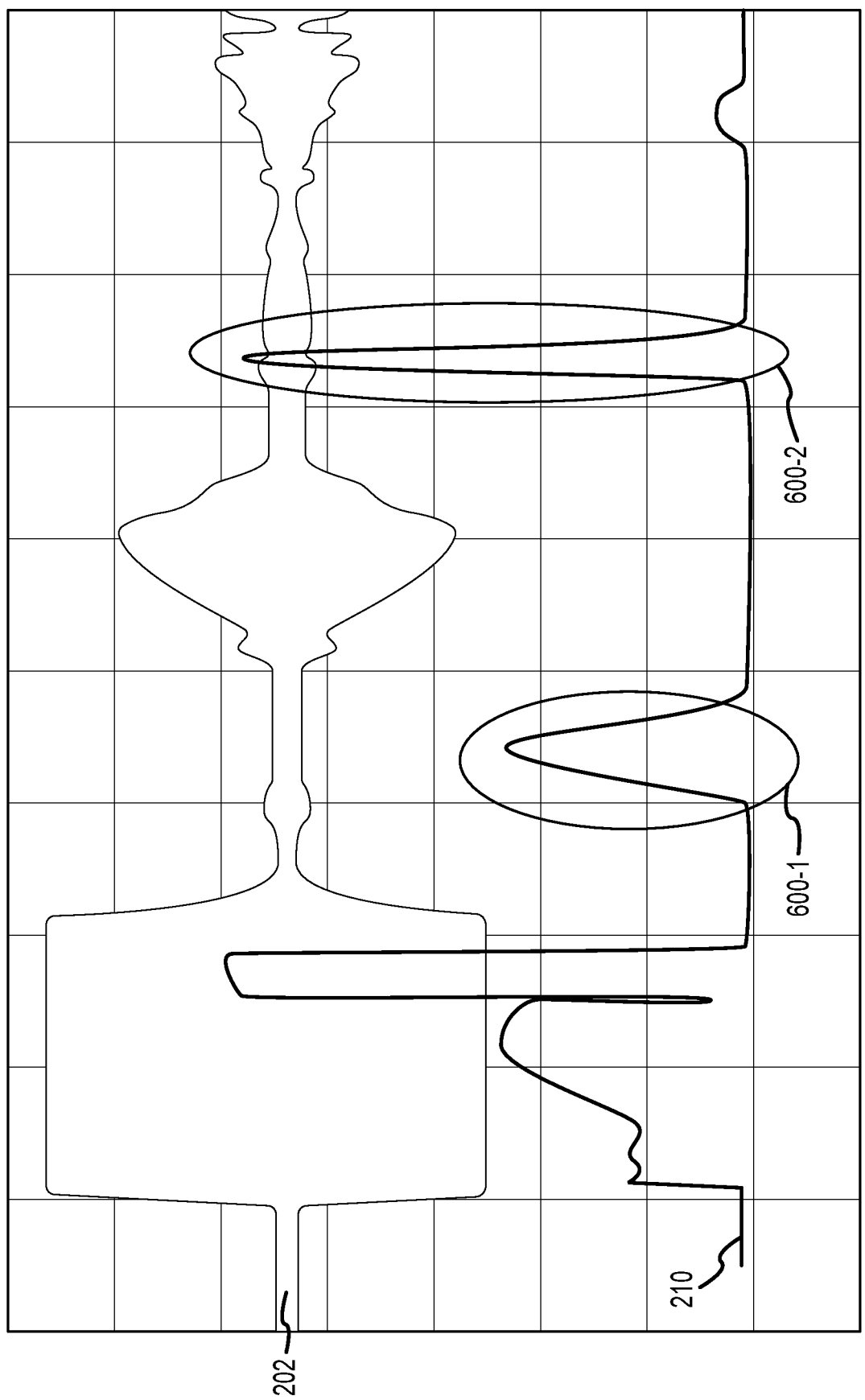

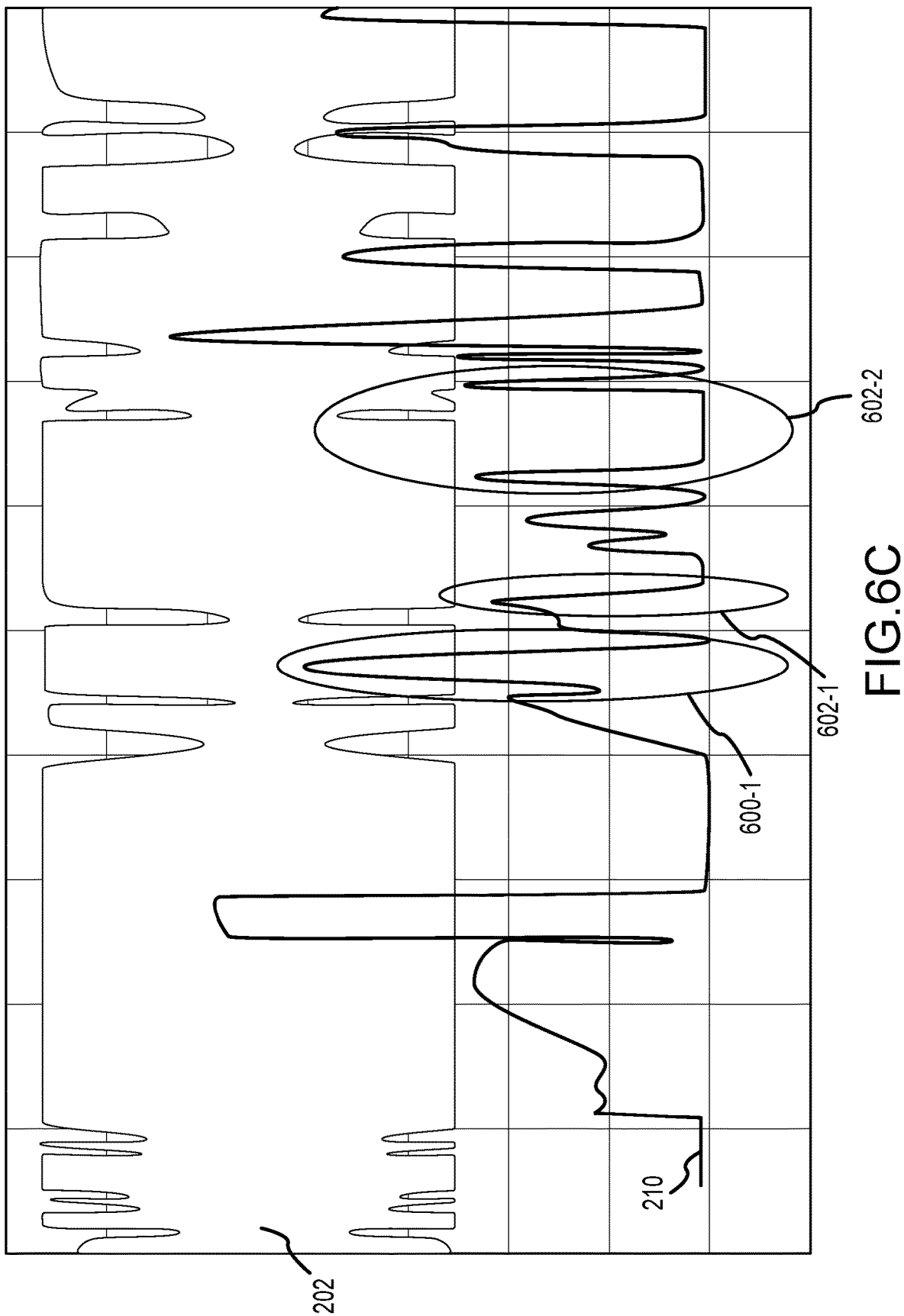

DEVICES, SYSTEMS AND PROCESSES FOR DETECTING SATURATION OF RECEIVED ECHO SIGNALS

CROSS REFERENCE TO RELATED APPLICATIONS

The present application claims priority to U.S. Provisional Application Ser. No. 62/909,378, filed on Oct. 2, 2019, in the name of inventors Marek Hustava, Michal Navratil and Pavel Kostelnik, entitled "ULS Sensor", the entirety of which is incorporated herein by reference.

TECHNICAL FIELD

The technology described herein generally relates to devices, systems, and processes for detecting obstacles. More specifically, the technology relates to parking assist sensors and other sensors used for detecting obstacles. Even more specifically, the technology relates to ultra-sonic sensors which use matched filter correlator processing to detect obstacles.

BACKGROUND

Today, various sensor systems are used with motor vehicle and other systems. Examples of such sensor systems include parking assist sensors, back-up sensors, blind spot detection sensors, collision avoidance, and others (collectively, herein "PAS" sensors). PAS systems are often used to assist a vehicle driver during parking, such a parallel parking, during lane changes, collision avoidance, and otherwise. A vehicle driver may range from a person to a fully automated/self-driving driving vehicle system. A PAS system often operates based upon sonar type principles, whereby an ultra-sonic soundwave is emitted and, based upon the reception of an echo, obstacles (if any) to be avoided are detected. Such obstacles may be of any form or type including, but not limited to, other vehicles, pedestrians, animals, fixtures (such as light poles, building portions and the like), and otherwise. The obstacle may be fixed or moving.

PAS systems typically are configured to detect obstacles over varying distances from the sensor, using sonar principles, and based upon a lapse of time between an emitting of a ranging signal and a reception of an echo, with the emission and reception being performed commonly by the same transponder. The varying distances may be those desired for a given PAS system and may include detections of obstacles that are located, relative to the transponder, near-range (e.g., within a meter), mid-range (e.g., within two (2) meters), and long-range (e.g., within seven (7) meters). Ranging signals are commonly emitted as one or more pulses. For some sensor functions, such as a blind spot detection system, the pulses may be repeatedly emitted while the vehicle is traveling. For other sensor functions, the pulses may be emitted only while the vehicle is configured for use during certain vehicle operations, such as parking, when in a reverse gear, or otherwise.

Often, a PAS system uses matched filter (correlation) processing to detect echoes that are representative of obstacles within a given range. Multiple gain stages may be used, with a lower gain setting being used to detect nearby obstacles and higher gain settings being used to detect obstacles at longer distances. To attend to noise issues, PAS systems typically initially monitor a received signal for the ambient noise level and adjust signal processing thresholds, gain levels and the like in accordance therewith. After the initialization phase, however, noise levels are not detected or monitored. Such noise levels may lead to various issues with echo signal reception and detection, including non-detection of actual echoes and detections of fake echoes.

More specifically, PAS systems currently available, especially those based on matched filter correlation processing, are often sensitive to echo signal saturation. Echo signal saturation may arise from any of a wide variety of noise sources, such as, out-of-band noises provided by airbrakes on trucks, and/or in-band noises. Echo signal saturation may occur while the echo signal is being received by an analog front-end of a transponder. Such saturation may result in fake echo detection. More specifically and when a received echo signal is saturated, fake echoes may arise due to an increased level of correlation noise. Further, in dual channel systems, crosstalk suppression may be impacted—resulting in increasing crosstalk between the respective channels which also may result in more fake echoes being detected.

Likewise, when the received echo signal is saturated, the PAS systems may miss real echoes. For example, real echoes may be effectively suppressed by a high level of out-of-band noise. Such suppression may effectively result in an inoperable sensor—the sensor may be effectively "blind." Such sensor blindness may occur without detection thereof by the PAS or other vehicle systems. Accordingly, devices, system and processes for addressing the above and other concerns with PAS systems are needed.

SUMMARY

The various embodiments of the present disclosure describe devices, systems, and processes for detecting saturation of received echo signals in PAS systems.

In accordance with at least one embodiment of the present disclosure, a process for detecting saturation of a received signal may include detecting, in a received signal and during a measurement interval, one or more correlated signal levels. For at least one embodiment, the process may include, as based on one or more results of the detecting, identifying, in a correlated output signal, portions of the received signal which exceed a given magnitude threshold during the measurement interval.

For at least one embodiment a process for detecting saturation of a received signal may include, providing the correlated output signal to an electronic control unit (ECU).

For at least one embodiment a process for detecting saturation of a received signal may include use of a correlated output signal output by a magnitude detector.

For at least one embodiment a process for detecting saturation of a received signal may include determining, by a saturation detector, whether a received signal is saturated during one or more portions of the measurement interval.

For at least one embodiment a process for detecting saturation of a received signal may include, when the received signal is saturated, generating a saturation signal, delaying the saturation signal to generate a delayed saturation signal, and providing the delayed saturation signal to the ECU substantially contemporaneously with the providing of the correlated output signal to the ECU.

For at least one embodiment a process for detecting saturation of a received signal may include use of a correlated output signal that may be indicative of at least one of a real echo and a fake echo when the identified portions of the received signal exceed the given magnitude threshold. The real echoes may be used by a PAS system to detect obstacles.

For at least one embodiment a process for detecting saturation of a received signal, the delayed saturation signal may indicate saturation of the received signal. The process may further include interpreting, by the ECU, at least one portion of the correlated output signal received substantially contemporaneously with the delayed saturation signal as including at least one of: a real echo; a real echo followed by one or more fake echoes; and one or more fake echoes.

For at least one embodiment a process for detecting saturation of a received signal may include use of an ECU which interprets the correlated output signal as including one or more fake echoes when the delayed saturation signal indicates repeated saturation of the received signal during the measurement interval.

For at least one embodiment a process for detecting saturation of a received signal may include the ECU determining that a repeated saturation of the received signal has occurred when the delayed saturation signal indicates a programmable number of portions of the correlated output signal are saturated during the measurement interval.

For at least one embodiment a process for detecting saturation of a received signal may include determining by a saturation threshold detector, during the measurement interval, whether the received signal exceeds a given saturation level. When the received signal exceeds the given saturation level, the process may further include one or more operations including: dynamically adjusting a gain level of a gain stage used while processing the received signal, adjusting, by a scaling element, a correlated output signal based upon a dynamic adjusting of the gain level of the gain stage, and providing to the ECU a scaled correlated output signal.

For at least one embodiment a process for detecting saturation of a received signal may include determining, by the ECU, whether to, at least one of: use the correlated output signal to identify an obstacle; use the scaled correlated output signal to identify an obstacle; and designate a PAS system as being blind during a given measurement interval.

For at least one embodiment a process for detecting saturation of a received signal may include, during a first given measurement interval, the ECU designating the PAS system as being blind when a repeated saturation of the received signal indicates a programmable number of portions of the correlated output signal are saturated.

For at least one embodiment a process for detecting saturation of a received signal may include during a second given measurement interval, the ECU designating the PAS system as being blind when the delayed saturation signal indicates the received signal is saturated during a given portion of the received signal and the correlated output signal does not indicate that the given portion of the received signal exceeds the given magnitude threshold.

For at least one embodiment a process for detecting saturation of a received signal may be useful when, during a first given measurement interval, an in-band noise saturates the received signal and when, during a second given measurement interval, an out-of-band noise saturates the received signal. The in-band noise may arise from a motor vehicle airbrake.

For at least one embodiment a process for detecting saturation of a received signal may include use of a HQ filter that receives the received signal, filters any out-of-band noise signal influenced portions out of the received signal, and outputs a filtered received signal. The process may include generating a correlated output signal by a magnitude detector from a filtered, received signal which does not identify any portion of the received signal as exceeding a given magnitude threshold during a measurement interval.

In accordance with at least one embodiment of the present disclosure, a system for detecting saturation of a received signal may include a transducer configured to emit a ranging signal and receive a received signal during a measurement interval. When an obstacle is within a given distance of the transducer, the received signal may include an echo of the ranging signal reflected off the obstacle. The system may include a gain stage, coupled to the transducer, configured to increase a received signal strength of the received signal. The system may include at least one of a saturation detector and a saturation threshold detector. Each of the saturation detector and the saturation threshold detector may be coupled to the gain stage. The saturation detector may be configured to detect saturation of the received signal during one or more portions of a measurement interval. The saturation threshold detector may be configured to determine a saturation threshold for the received signal.

For at least one embodiment a system for detecting saturation of a received signal may include a digital filter, coupled to the gain stage, configured to convert the received signal into a filtered received signal.

For at least one embodiment a system for detecting saturation of a received signal may include a magnitude detector, coupled to the digital filter. The magnitude detector may be configured to detect, during the measurement interval, one or more portions of the filtered received signal which exceed a given threshold and are each a potential echo. The magnitude detector may be configured to, based on such detecting, output a correlated received signal indicative thereof.

For at least one embodiment a system for detecting saturation of a received signal may include a delay element, coupled to a saturation detector. The saturation detector may be configured to output a saturation signal. The delay element may be configured to receive the saturation signal, and after a predetermined delay period, output a delayed saturation signal indicative of the one or more portions of the received signal, during the measurement interval, that are received at a saturated level. For at least one embodiment, the predetermined delay period may correspond to a processing delay for the digital filter.

For at least one embodiment a system for detecting saturation of a received signal may be configured for use when the received signal includes out-of-band noise during the measurement interval and the correlated output signal does not indicate a presence of any echoes within the received signal.

For at least one embodiment a system for detecting saturation of a received signal may include an electronic control unit which receives each of a correlated output signal and a delayed saturation signal.

For at least one embodiment, the ECU may be configured to disregard at least one second echo identified in the correlated output signal when: a presence of a first echo identified in the correlated output signal occurs substantially contemporaneously with an indication, in the delayed saturation signal, that the received signal is saturated during the first echo; and the at least one second echo arises within a given period of the first echo in the measurement interval.

For at least one embodiment, the ECU may be configured to disregard two or more echoes when the delayed saturation signal indicates the received signal is saturated for more than a given portion of the measurement interval.

For at least one embodiment, the ECU may be configured to designate the system as being blind when the correlated output signal provides no indication of any echoes detected within the received signal while the delayed saturation signal indicates that the received signal is saturated during the measurement interval.

For at least one embodiment a system for detecting saturation of a received signal may include use of a gain stage that is adjustable to one or more gain settings. For at least one embodiment, a first gain setting may be used for detecting near-range obstacles. For at least one embodiment, a second gain setting may be used for detecting mid-range obstacles. For at least one embodiment, a third gain setting may be used for detecting long-range obstacles.

For at least one embodiment a system for detecting saturation of a received signal may include a saturation threshold detector configured to output a saturation level signal indicative of the saturation level of the received signal during a given portion of the measurement interval.

For at least one embodiment a system for detecting saturation of a received signal may include a dynamic gain stage, coupled to a saturation threshold detector and a gain stage, configured to adjust the gain stage between one or more of a first gain setting, a second gain setting and a third gain setting. For at least one embodiment, the dynamic gain stage may be configured to adjust the gain stage such that the saturation level of the received signal remains below a determined saturation threshold.

For at least one embodiment a system for detecting saturation of a received signal may include a scaling element, coupled to a magnitude detector, configured to scale a correlated input signal based upon adjustments by a dynamic gain stage to a gain stage.

For at least one embodiment a system for detecting saturation of a received signal may include a dynamic gain stage configured to maintain a determined saturation threshold at less or equal to a programmable level.

For at least one embodiment a system for detecting saturation of a received signal may include use of a saturation detector and a saturation threshold detector that operate in either the analog domain or the digital domain.

BRIEF DESCRIPTION OF THE DRAWINGS

The features, aspects, advantages, functions, modules, and components of the devices, systems and processes provided by the various embodiments of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When only the first reference label is used in the specification, the description is applicable to any of the similar components and/or views having the same first reference number irrespective of any additional alphabetic designators or second reference labels, if any.

FIG. 2A is representation of an actual echo being missed due to received signal saturation arising from a noisy environment.

FIG. 2B is representation of a fake echo being detected due to received signal saturation arising from a noisy environment.

FIG. 6A is an illustrative representation of signals processed by the circuits of FIGS. 5A and 5B to detect saturation of received echo signals when no noise is present and a low gain setting is used and in accordance with at least one embodiment of the present disclosure.

FIG. 6C is an illustrative representation of signals processed by the circuits of FIGS. 5A and 5B to detect saturation of received echo signals when noise is present and a high gain setting is used and in accordance with at least one embodiment of the present disclosure.

DETAILED DESCRIPTION

The various embodiments described herein are directed to devices, systems and processes for detecting receiver saturation during echo reception for ultra-sonic PAS systems. In accordance with at least one embodiment of the present disclosure, during active echo monitoring, devices, systems and processes are provided for detecting a saturation of a received analog signal.

Figure 1:
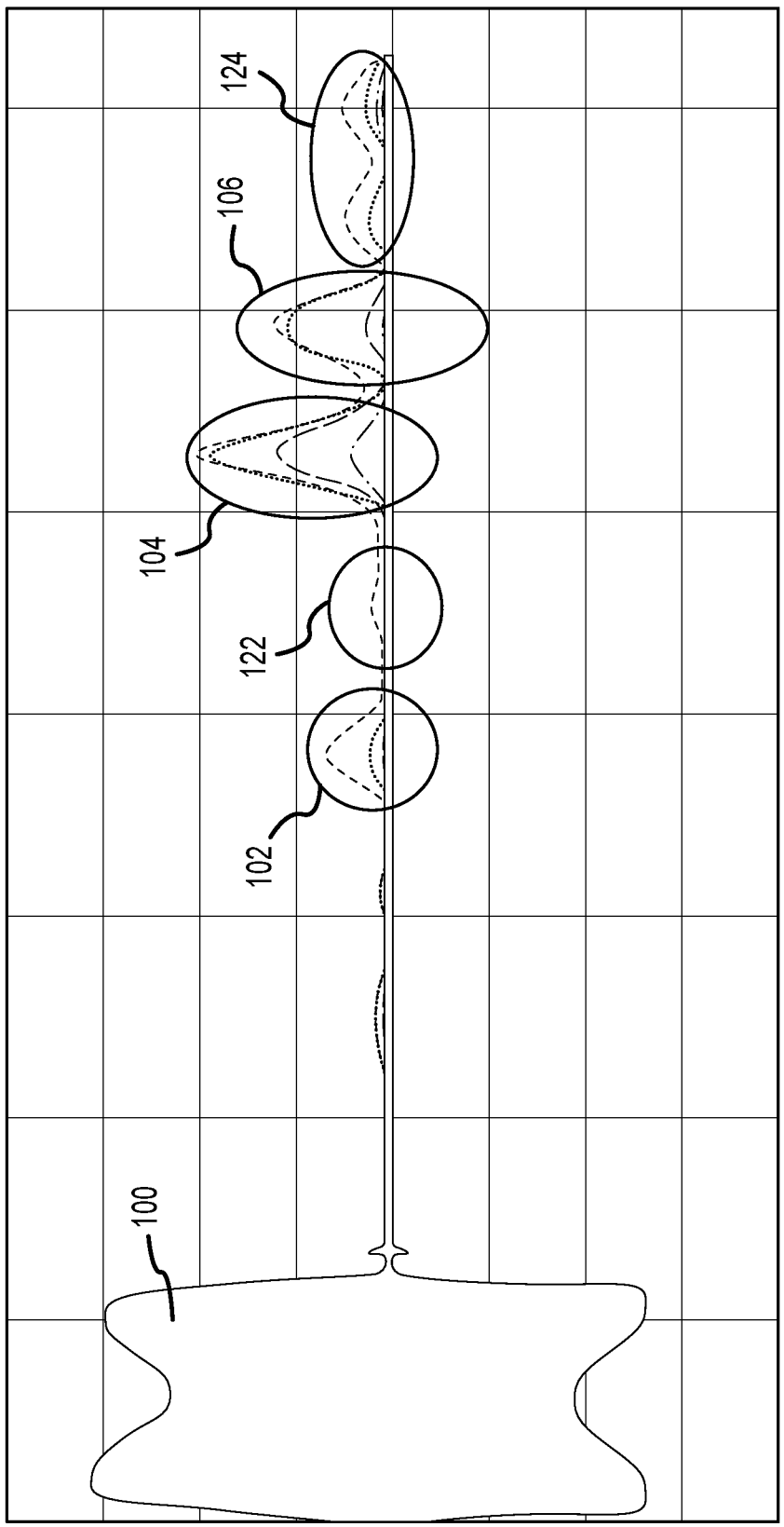
FIG. 1 is a time versus voltage representation of one or more actual echoes and one or more fake echoes being detectable, where the fake echoes are detected at higher gain levels and when the receiver is saturated.

As shown in FIG. 1, a ranging signal (not shown) is emitted by a PAS transponder and a reflection thereof is received—the received ranging signal 100. As shown, the received ranging signal 100 (and other signals herein) are depicted based upon a representative signal "envelope" and not each of the individually received signals. It is to be appreciated that the various signals have varying voltages over time and are not a commonly a smooth or continuous waveform signal, as shown herewith. Accordingly, the various figures depict signal "envelopes" to convey one or more of the various inventive features of the present disclosure. The received ranging signal 100 may be emitted at various voltage levels and over a given time period, such as over two (2) milli-seconds and may be immediately reflected by vehicle components, the ground, or otherwise. One or more "actual echoes" (as distinguished from fake or suppressed echoes) may also be received, with the time difference occurring between transmission of the ranging signal and reception of the received echo being indicative of a relative distance of an obstacle from the PAS sensor. Such actual echoes may include, for example, a first echo 102, a second echo 104, and a third echo 106. It is to be appreciated that echo detection may occur in the analog or digital domain.

The actual echoes 102/104/106 may be detected at various gain settings. Such detection may occur when the received signal is non-saturated or when it is saturated. As shown in FIG. 1, such representative gain settings may include a first gain setting 108 (e.g., 60 dB(V)), a second gain setting (not shown) (e.g., 65 dB(V)), a third gain setting 112 (e.g., 70 dB(V)), a fourth gain setting (not shown) (e.g., 75 dB (V)), a fifth gain setting 116 (e.g., 80 dB (V)), a sixth gain setting (not shown) (e.g., 85 dB (V)), and a seventh gain setting 120 (e.g., 90 dB (V)). Echoes received and corresponding to the fourth, fifth, sixth and seventh gain settings may be saturated. It is to be appreciated that the actual gain settings may vary, an echo may be detected at any desired gain level, and saturation may or may not occur at any given gain level.

Further, as discussed above, fake echoes may be detected when the received signal is at saturation. For example, a first fake echo 122 may be detected when the seventh gain setting 120 is used and the received echo signal is saturated. Similarly, a pair of second fake echoes 124 may be detected at the seventh gain setting 120. As discussed above, such higher gain settings may be used to detect obstacles at greater distances from the PAS transponder.

As shown in FIG. 2A and in FIG. 2B and as further shown in FIGS. 3A, 3B, 5A, 5B, 7A and 7B, a transducer 302 may first be calibrated during an ambient noise monitoring period 201 to determine an ambient noise level. Such calibration occurs before active echo monitoring begins. At a desired time, the transducer 302 is provided with an input voltage that results in a ranging signal 200 being emitted. The ranging signal 200 may be emitted as a burst signal. The transducer 302 may include an analog input for receiving a received signal 202. The received signal 202 may be depicted as a differential voltage and, as shown, may include the reflected ranging signal portion 204, as sensed by the receiving side of the transducer, and any later received echoes 206-1, 206-2, 206-3, 206-4, 206-5 and 206-6.

As further shown in FIG. 2A (where noise is not shown) and in FIG. 2B (where noise is shown), the received signal 202 may be received at a saturated level, as detected by a saturation detector (described below) and as illustrated by a saturation signal 208. More specifically, the saturation signal 208, as corresponding to the first echo 206-1 is received at a saturated value. From the received signal 202, a correlated output signal 210 may be generated. It is to be appreciated that the correlated output signal 210 is time delayed relative to the received signal 202.

The correlated output signal 210 may be influenced by saturation of the received signal 202 and noise. For example, and as shown in FIG. 2A, saturation of a first echo 206-1 results in a later received second echo 206-2 not exceeding a saturation threshold 212 and therefore not being detected when below the saturation threshold 212. The second echo 206-2 may be, for example, a ground reflection of the first echo 206-1. As shown in FIG. 2B, when noise is present, the second echo 206-2 is enhanced and may be received as a double peak signal of the first echo 206-1 instead of as a separately arising echo. Likewise, as shown in FIGS. 2A and 2B, saturation of the received signal 202, may also result in lingering noise that results in one or more fake echoes being detected, such as fake echo 206-6. For at least one embodiment, the process includes detection of saturation of the received signal 202, as shown by the saturation signal 208, facilitates detection of the noise, such as airbrake noise, that otherwise results in missed and/or fake echoes.

Figure 3A:
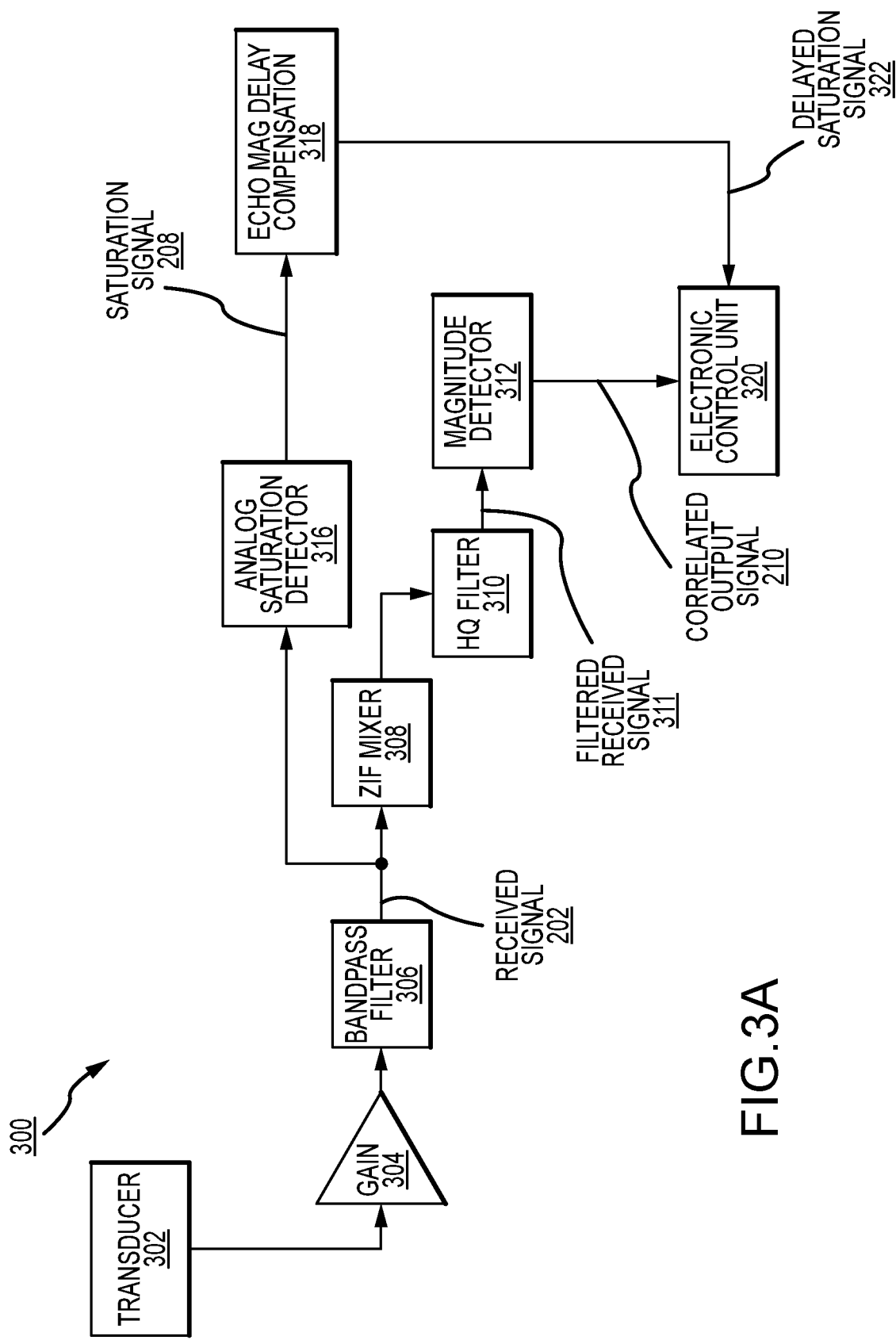
FIG. 3A is a schematic diagram of a first circuit for use, in the analog domain, in detecting receiver saturation during echo reception and in accordance with at least one embodiment of the present disclosure.

As shown in FIG. 3A and in accordance with at least one embodiment of the present disclosure, a first circuit 300 configured to detect saturation of the received signal 202 may include a transducer 302 electrically coupled to at least one gain stage 304 and to a bandpass filter 306. The received signal 202 generated includes the reflected ranging signal 204 and any echoes 206. It is to be appreciated that the gain stage 304 may include one or more gain stages operating in parallel, with each gain stage outputting a separate received signal that is further processed by the circuit 300. Various gain stage settings may be used including, but not limited to, the first gain setting 108, second gain setting, third gain setting 112, fourth gain setting, fifth gain setting 116, sixth gain setting, seventh gain setting 120, or otherwise. As discussed above, higher gain stage settings may be used to facilitate obstacle detection at greater distances, with greater resolution (as may arise from multiple echoes being detected at multiple gain settings and at substantially the same time), or otherwise.

The gain stage 304 may be electrically coupled to a bandpass filter 306. For at least one embodiment, the bandpass filter 306 may be used to reduce noise in the received signal 202. The bandpass filter 306 may be electrically coupled in parallel to each of a mixer, such as a ZIF mixer 308, and an analog saturation detector 316. Such components are ordinary and well known in the art.

Figure 3B:
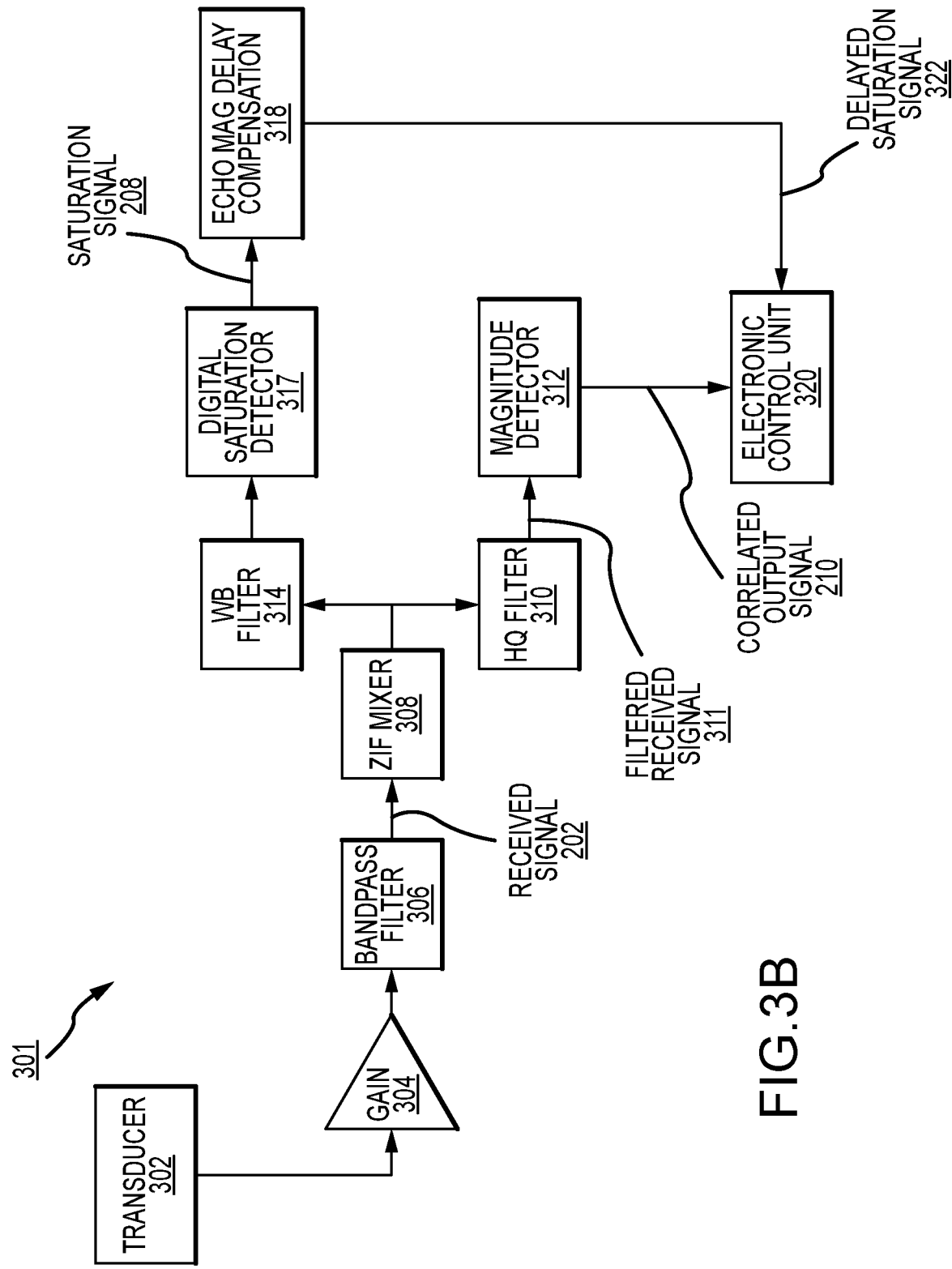
FIG. 3B is a schematic diagram of a first circuit for use, in the digital domain, in detecting receiver saturation during echo reception and in accordance with at least one embodiment of the present disclosure.

The circuits shown in FIGS. 3A and 3B are substantially similar with the FIG. 3A circuit 300 being configured to detect saturation of the received signal 202 in the analog domain and accordingly including an analog saturation detector 316. In FIG. 3B, the second circuit 301 is configured to detect saturation of the received signal 202 in the digital domain and accordingly includes a digital saturation detector 317. For at least one embodiment, the saturation detectors 316/317 determine whether the received signal 202, as gain adjusted, filtered, and/or otherwise processed is saturated and, based upon such determinations, output the saturation signal 208. For at least one embodiment, the saturation detectors 316/317 may be configured to generate a saturation signal 208 that indicates whether the received signal 202 includes noise. For at least one embodiment, the first circuit 300 and second circuit 301 may provide for both saturation detection and noise detection. The first circuit 300 and second circuit 301 may be configured to provide, during normal operations, a continued correlated output signal 210 and a delayed saturation signal 322 to the ECU 320.

As shown in FIG. 3B for digital domain saturation detection, the circuit 301 may include a wideband (WB) filter 314 which receives an output signal from the ZIF mixer 308 and provides a further filtered signal to the digital saturation detector 317.

As further shown in each of FIG. 3A and in FIG. 3B, the ZIF mixer 308 may be electrically coupled to a high Q ("HQ") filter 310. It is to be appreciated that a processing delay commonly occurs from use of the HQ filter. The magnitude of such delay may be determined or measured. The HQ filter 310 outputs a digitally filtered version of the received signal, which is herein referred to as the filtered received signal 311.

As further shown in each of FIG. 3A and in FIG. 3B, the HQ filter 310 may be electrically coupled to a magnitude detector 312. The magnitude detector 312 may be configured to provide the correlated output signal 210 to an electronic control unit ("ECU") 320. For at least one embodiment of the present disclosure, the filtering and magnitude detecting of the received signal 202, as provided by the HQ filter 310 and the magnitude detector 312, may be combined and provided in a correlator (not shown). For at least one embodiment, the correlated output signal 210 indicates when the received signal 202 is above a detection threshold. The detection threshold may vary based upon a given gain factor used and other factors. The detection threshold may be used to detect echoes, noise (such as engine brake noise), or otherwise. For at least one embodiment, the correlated output signal 210, when present, is indicative of an obstacle potentially being detected based on an echo being reflected therefrom. For at least one embodiment, the correlated output signal 210 indicates when the received signal 202 exceeds a given threshold including, but not limited to, a pre-determined threshold.

As respectively shown in FIGS. 3A and 3B, the analog saturation detector 316 and the digital saturation detector 317 are electrically coupled to an echo magnitude delay compensation element 318 (or "delay element"). The delay element 318 may be configured to compensate for any signal processing delays arising from use of the HQ filter 310 so that the saturation signal 208, as ultimately provided to the ECU 320, is in synch with the correlated output signal 210. Accordingly, the delay element 318 may be configured to output a delayed saturation signal 322 to the ECU 320. For at least one embodiment, the delayed saturation signal 322 is time delayed representation of the saturation signal 208.

For at least one embodiment, the circuits 300/301 may be used to facilitate noise monitoring. It is to be appreciated that noise monitoring may be used to ensure compliance of a vehicle with various noise restrictions, such as compression release engine braking restrictions, and others. For at least one embodiment, the delayed saturation signal 322 may indicate whether a potential undesired noise, such as an engine break noise, has been detected.

For at least one embodiment, the delayed saturation signal 322 may indicate an undesired noise, such as airbrake noise, has been detected for each measurement interval during which the undesired noise is detected. Other reporting intervals may be used for other embodiments. For at least one embodiment, an undesired noise level may be determined by the EU 320 when a programmable number of multiple fake echoes, have been detected within a given measurement interval. A length for such measurement interval may be fixed, variable, pre-determined, or otherwise.

For at least one embodiment, and when saturation is detected and reported in the delayed saturation signal 322 to the ECU 320, the ECU 320 may be configured to suppress any echoes detected within a given time interval of receipt of a delayed saturation signal 322 level that exceeds a predetermined threshold. The delayed saturation signal 322 may indicate to the ECU 320 that the PAS is blind due to the received signal 202 being saturated. The delayed saturation signal 322 may indicate to the ECU 320 that a potential fake echo has been detected. For at least one embodiment, the delayed saturation signal 322 may indicate a fake echo has been detected for each measurement occurring while the PAS is saturated.

Figure 4:
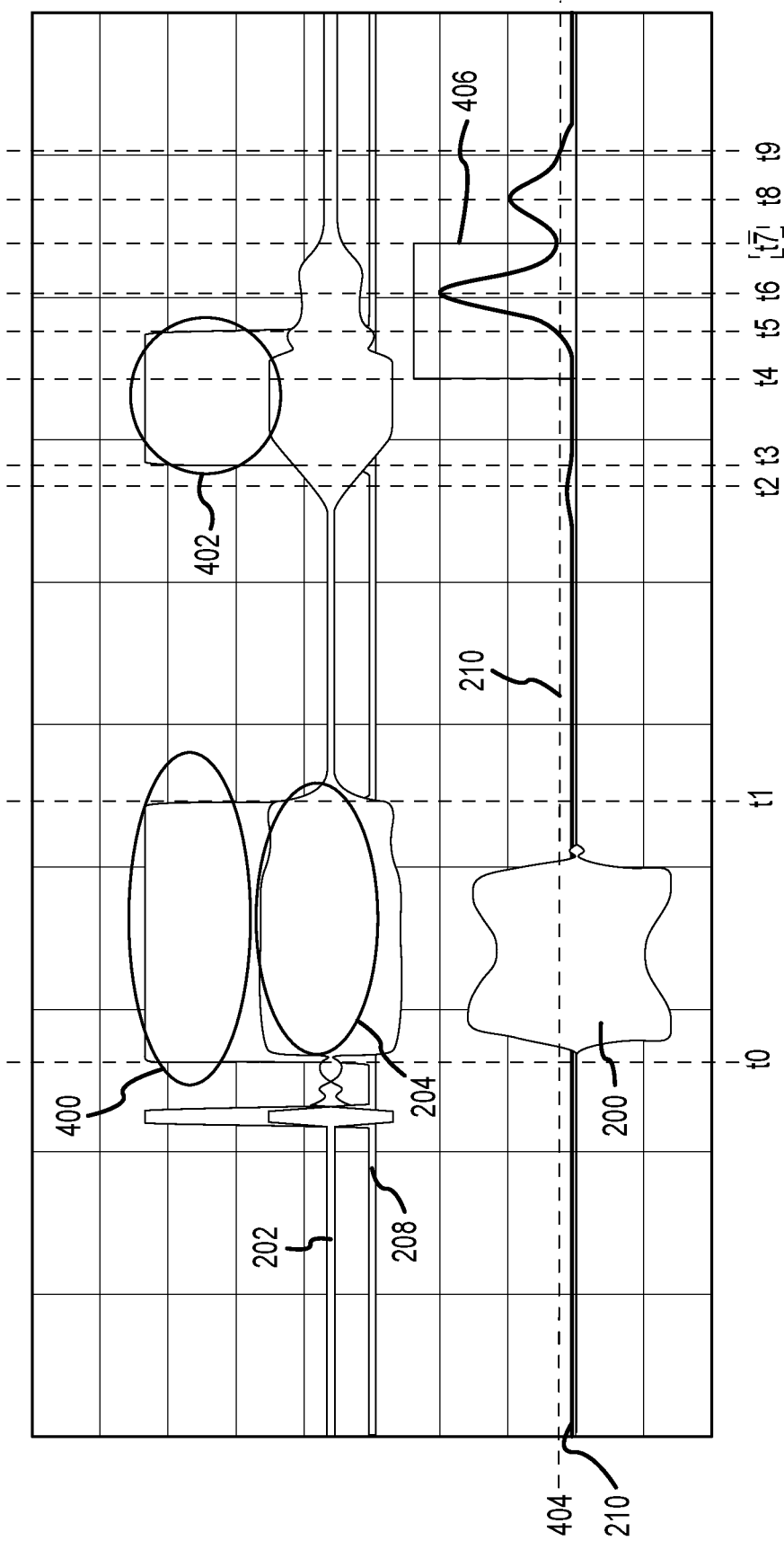
FIG. 4 is an illustrative representation of signals processed by the circuits of FIGS. 3A and 3B to detect saturation of received echo signals and in accordance with at least one embodiment of the present disclosure.

As shown in FIG. 4 and for at least one embodiment of the present disclosure, one or more of the above discussed signals are shown. More specifically, at an initial time t0 and thru a first time, t1, the ranging signal 200 is emitted by the transducer 302 and detected thereby in the received signal 202 as the reflected ranging signal 204 portion. Such detection occurs substantially simultaneously with emission of the ranging signal 200 by the transducer 302. The circuits 301/302 accordingly detect that a first portion 400 of the saturation signal 208 is high (saturated). At a second time, t2, the received signal 202 again increases in value, presumably due to reflection of the ranging signal 200 off an obstacle. At time t3, the received signal 202 saturates, which the saturation detector 316/317 detect, as shown by the second portion 402 of the saturation signal 208. The saturation signal 208 remains at an elevated (high) level thru time t5. The delay element 318 time delays the saturation signal 208 and, from time t4 to t7, the delayed saturation signal 322 is output to the ECU 320. It is to be appreciated that the intervals t3 to t5 and t4 to t7 are substantially the same.

As further shown, from substantially t4 thru t9, the correlated output signal 210 is elevated above a predetermined detection threshold 404, such as a background noise threshold, or other threshold. During this period, the correlated output signal 210 includes a first echo beginning at time t5, having a first peak at time t6, and ending at time t7, and a second echo beginning at time t7, having a second peak at time t8, and ending at time t9. Such elevated levels are reported by the magnitude detector 312 to the ECU 320. But, since each of these echoes arise during a time period overlapping with the delayed saturation signal 322, the ECU 320 interprets the first echo and second echo, as otherwise identified by the magnitude detector 312 in the magnitude signal 322, as a single echo, which absent the noise would likely appear as real echo 406. The ECU 320 accordingly recognizes that presence of the saturation, as provided by the delayed saturation signal 322 and interprets the first echo provided correlated output signal 210 as a real echo and interprets and suppresses the second echo as corresponding to noise in the correlated output signal 210.

In accordance with at least one embodiment, a saturation detector 316/317 may be configured to indicate to the ECU that the received signal 202 is saturated while the correlated output signal 210 does not indicate any echoes are being received. When such condition arises the PAS system is effectively blind. Accordingly, the ECU may be configured to interpret such condition as arising from a blind sensor. It is to be appreciated that such sensor blindness may arise, for example, by out-of-band noise appearing in the received signal 202. For example, a transducer 302 may be configured for reception of echo signals at 50-60 kHz, yet, another signal may arise at a frequency, such as 400 kHz, and at a signal strength of sufficient magnitude to effectively saturate the transducer 302. It is to be appreciated, that while the HQ filter 310 effectively suppresses such out-of-band noise, the resulting correlated output signal 210, as provided to the ECU 320, indicates that no correlated output signal 210 is present. Yet, the delayed saturation signal 322 indicates that the received signal 202 is saturated. Accordingly, the ECU 320 may be configured to interpret such condition are indicative of a blind, or otherwise malfunctioning, PAS system.

In accordance with at least one embodiment of the present disclosure and in accordance with the embodiments of FIGS. 3A and 3B, a process for detecting saturation of echo signals may include detecting when a received echo signal is saturated, and delaying communication of a saturation level signal to an ECU such that the ECU receives a correlated output signal at substantially the same time it receives a delayed saturation signal and responds to the same by ignoring second or later echoes otherwise arising in the correlated output signal while the delayed saturation signal indicates that the received signal is saturated.

Figure 5A:
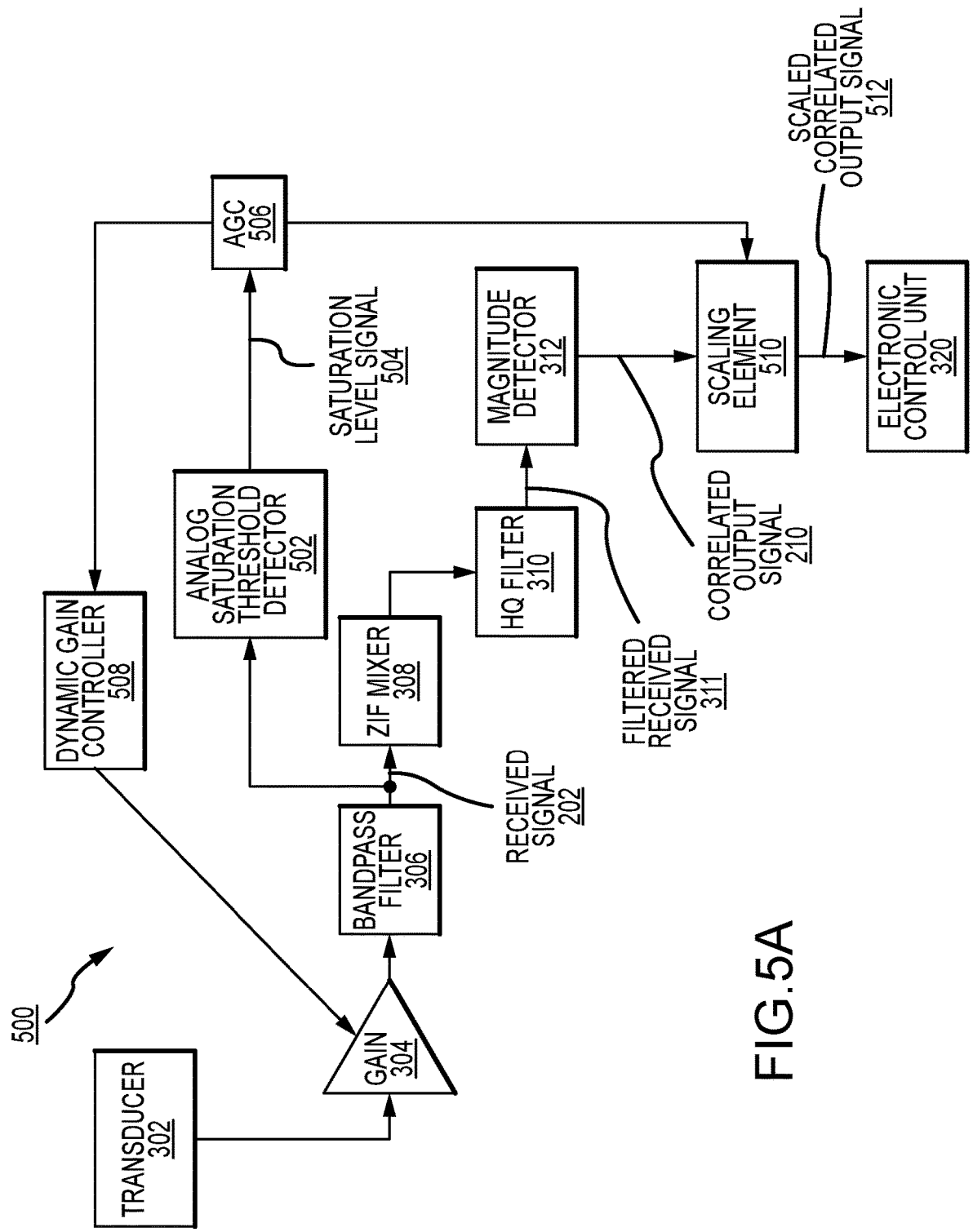
FIG. 5A is a schematic diagram of a second circuit for use, in the analog domain, in adjusting gain levels used to minimize and/or negate receiver saturation during echo reception and in accordance with at least one embodiment of the present disclosure.
Figure 5B:
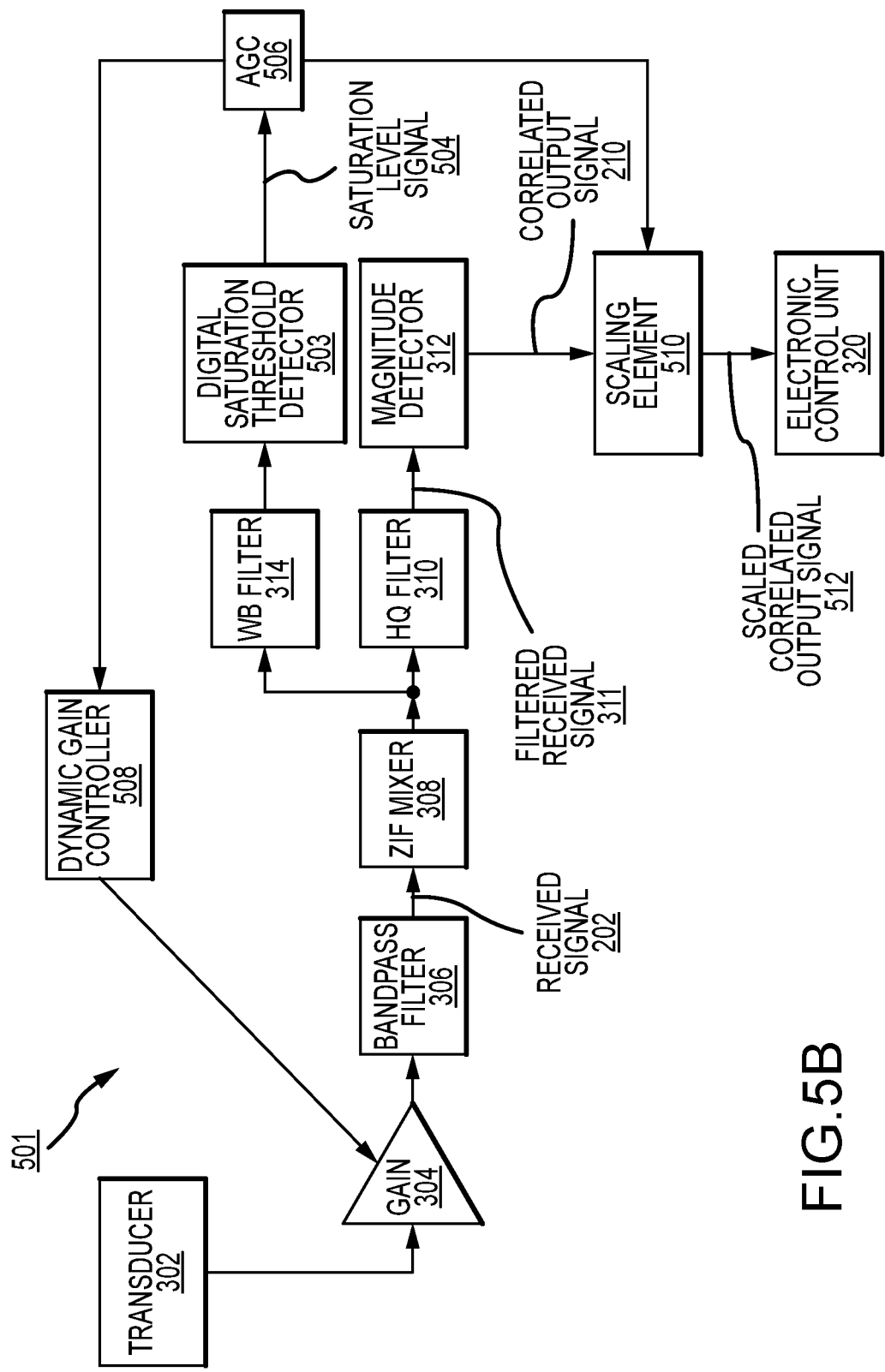
FIG. 5B is a schematic diagram of a second circuit for use, in the digital domain, in adjusting gain levels used to minimize and/or mitigate receiver saturation during echo reception and in accordance with at least one embodiment of the present disclosure.

As shown in FIG. 5A (for the analog domain) and in FIG. 5B (for the digital domain), another embodiment of a third circuit 500 and a fourth circuit 501 for detecting saturation of received PAS signals includes many of the components discussed above with the FIGS. 3A and 3B embodiments. Such description also applies to the FIGS. 5A and 5B embodiments and, accordingly, is not repeated herein again. As shown, each of the third circuit 500 and the fourth circuit 501 are configured to include a saturation threshold detector 502/503. The saturation threshold detectors 502/503 detect saturation of the received signal 202 and a saturation level thereof and outputs a saturation level signal 504. The saturation threshold detectors 502/503 are electrically coupled to an automatic gain control (AGC) 506. The AGC 506 is electrically coupled to a dynamic gain controller 508 and to a scaling element 510. The scaling element 510 is also electrically coupled to the magnitude detector 312 and receives the correlated output signal 210.

Figure 6B:
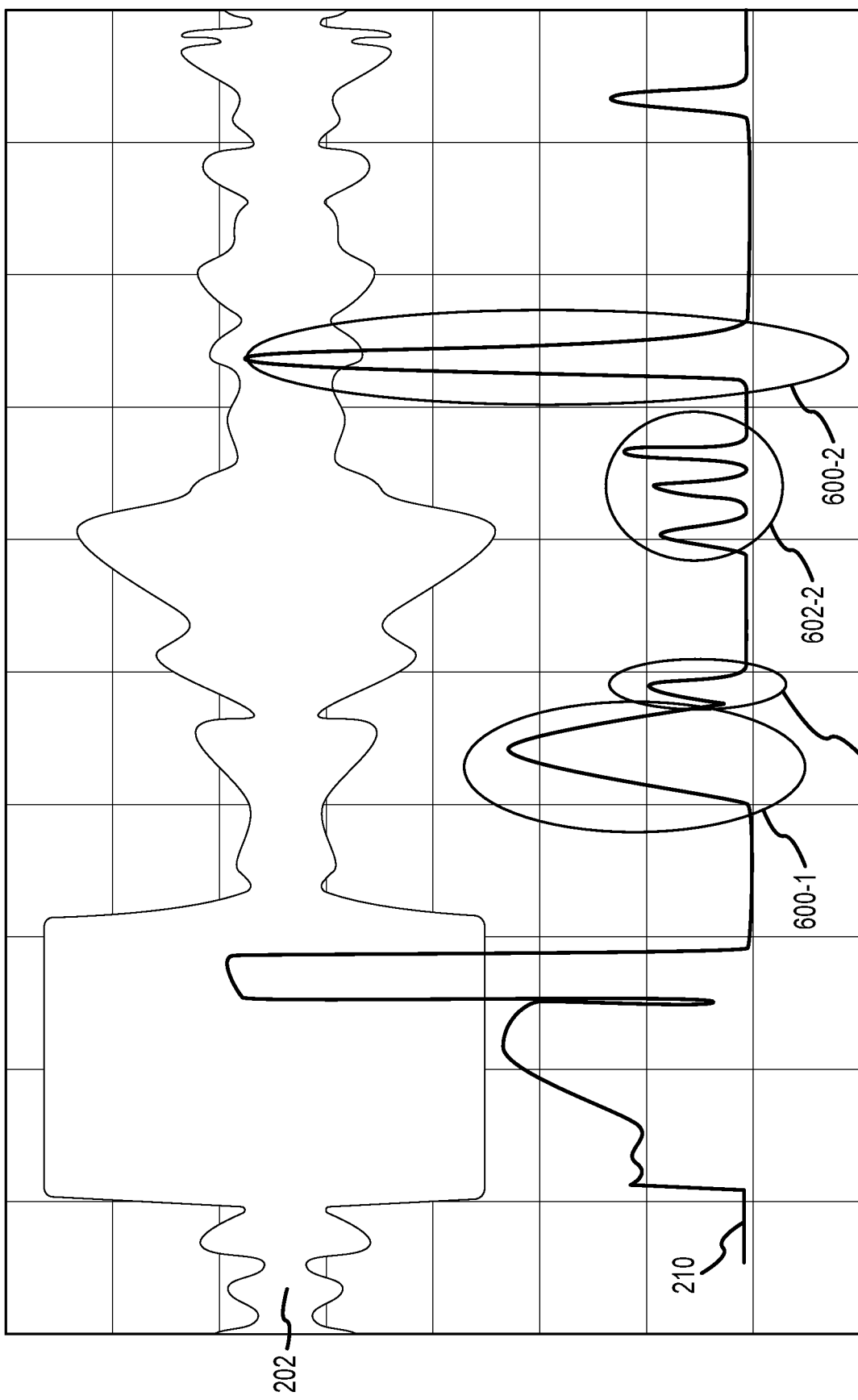
FIG. 6B is an illustrative representation of signals processed by the circuits of FIGS. 5A and 5B to detect saturation of received echo signals when noise is present and a low gain setting is used and in accordance with at least one embodiment of the present disclosure.

For at least one embodiment, the third circuit 500 and fourth circuit 501 may be configured to determine when a received signal 202 is saturated, the level of gain at which saturation is occurring, and adjust the gain such that saturation is avoided. More specifically, the saturation threshold detectors 502/503 receive the received signal 202 (as further processed for the digital domain) and determine whether it is saturated and the level at which such saturation is occurring. For example, as shown in FIG. 6A, a received signal 202 may be received at a low gain setting and with no noise present. For such a received signal 202, real echoes 600-1 and 600-2 are readily detectable in the correlated output signal 210 and no gain adjustments are needed by the AGC 504 and the dynamic gain controller 508. However, when noise is present, as shown in FIG. 6B, detection of echoes in the correlated output signal 210 becomes more difficult and one or more fake echoes may be detected, such as fake echoes 602-1 and 602-2. Accordingly, the AGC 504 and the dynamic gain controller 508 may reduce the gain of the circuit such that the effect of any noise in the received signal is minimized by lowering the level of the received signal 202 such that it is no longer received at a saturated level. As further shown in FIG. 6C, when high noise is present and a higher gain is used, such as a fourth or higher gain setting, the received signal 202 may become substantially completely saturated. Such substantially complete saturation of the received signal 202 may result in one or more real echoes being suppressed and not detected, such as the first echo 600-1. Accordingly, the AGC 504 and dynamic gain controller 508 may be configured to substantially reduce the gain of the circuits 500/501 until the effects of the high noise are mitigated. For at least one embodiment, the AGC 504 and dynamic gain controller 508 (collectively, the "dynamic gain stage") may be configured to begin reducing the gain when the level of the received signal 202 is above half of the full-scale level. For at least one embodiment, the full-scale level is programmable. A full-scale voltage may be at eighty percent (80%) with half of full scale at forty percent (40%).

For at least one embodiment, the dynamic gain stage includes a low noise amplifier and a variable gain element. For at least one embodiment, the gain stage may continuously vary the gain, such as using 0.3 dB to 0.5 dB adjustments, to avoid dynamic impacts on the level of the received signal 202.

It is to be appreciated that other gain levels adjustments may be used, and such gain level adjustments may be used based upon a configurable threshold for a given implementation of an embodiment of the present disclosure. Further, it is to be appreciated that a gain adjustment that is too great and results in a level of the received signal 202 that is too low, may result in one more rounding errors. Accordingly, and for at least one embodiment, a range for gain adjustments corresponds to a calculation precision used by the ECU.

As further shown in FIGS. 5A and 5B and introduced above, the third and fourth circuits 500/501 may include the scaling element 510. For at least one embodiment, the scaling element 510 adjusts the correlated output signal 210 by an inverse of any gain control provided by the AGC 506 such that a discontinuity does not arise in the signal values provided to the ECU 320. The scaling element 510 outputs a scaled correlated output signal 512 to the ECU 320.

It is to be appreciated that the embodiments of FIGS. 5A and 5B provide a closed loop system, wherein gain reductions in the received signal 202 may occur without involvement of the ECU 320 and during a current processing interval (wherein a processing interval commences with a sending of the ranging signal 200 and ends a predetermined time thereafter). In comparison, for the embodiments of FIGS. 3A and 3B, which provide an open loop system, gain reductions, if any, occur during a subsequent processing interval and by the ECU 320 selecting a lower gain level for the subsequent processing interval.

It is also to be appreciated that dynamic gain control elements may be used in currently available systems to adjust gains, and echo reception, for obstacles at greater distances, such as those at up to seven (7) meters. Such capabilities are unchanged by the various embodiments of the present disclosure and any effects of noise on obstacle detections at such greater distances will likely remain. However, unlike current systems, the various embodiments of the present disclosure can suppress noise such that obstacle detections can occur at closer distances, such as those under two (2) meters. That is, the various embodiments of the present disclosure facilitate obstacle detection, even under high noise levels, of obstacles within two (2) meters of the PAS system.

In accordance with at least one embodiment of the present disclosure and in accordance with the embodiments of FIGS. 5A and 5B, a process for detecting saturation of echo signals may include detecting when a received signal is saturated, dynamically adjusting a gain level used for the receiving transponder until the received signal is no longer saturated and applying an inverse gain adjustment to a correlated output signal provided to an ECU, such that echoes present in the received signal at a lower gain setting are not saturated and are detectable and processed by the ECU while fake echoes present in the received signal at higher, saturated gain settings are disregarded and not processed by the ECU.

It is to be appreciated, however, that under high noise environments, reduction of gain may not be sufficient to prevent saturation of the received signal and blindness of the PAS system. Accordingly, and as shown in FIGS. 7A and 7B a fifth circuit 700 (for the analog domain) and a sixth circuit 701 (for the digital domain) may combine and include the saturation detection capabilities of the first and second circuits 300/301 of FIGS. 3A and 3B as well as the saturation threshold detection capabilities and gain stage adjustment capabilities of the third and fourth circuits 500/501 of FIGS. 5A and 5B.

Figure 7A:
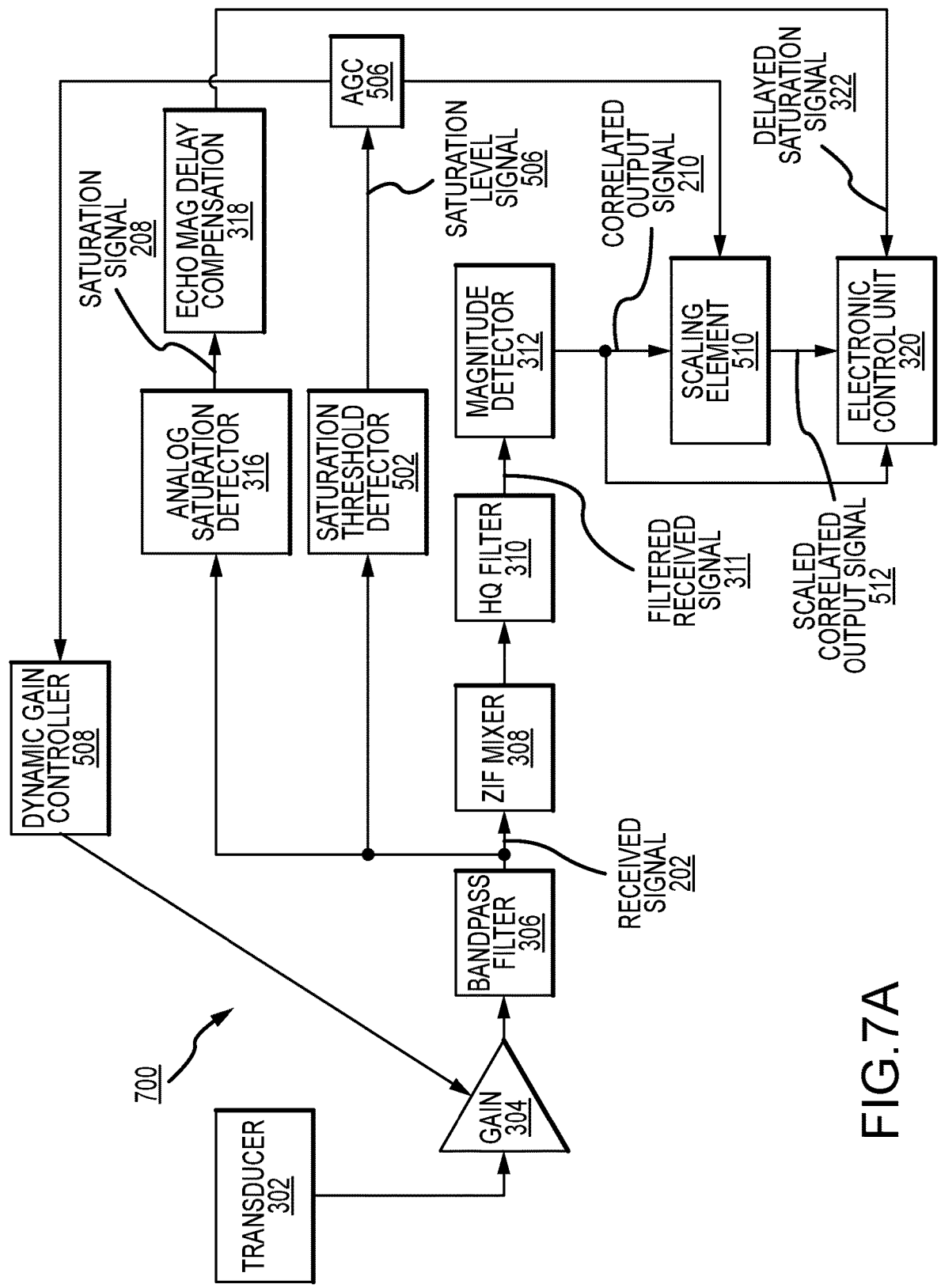
FIG. 7A is a schematic diagram of a third circuit for use, in the analog domain, which combines features of the circuit of FIGS. 3A and 5A, and in accordance with at least one embodiment of the present disclosure.
Figure 7B:
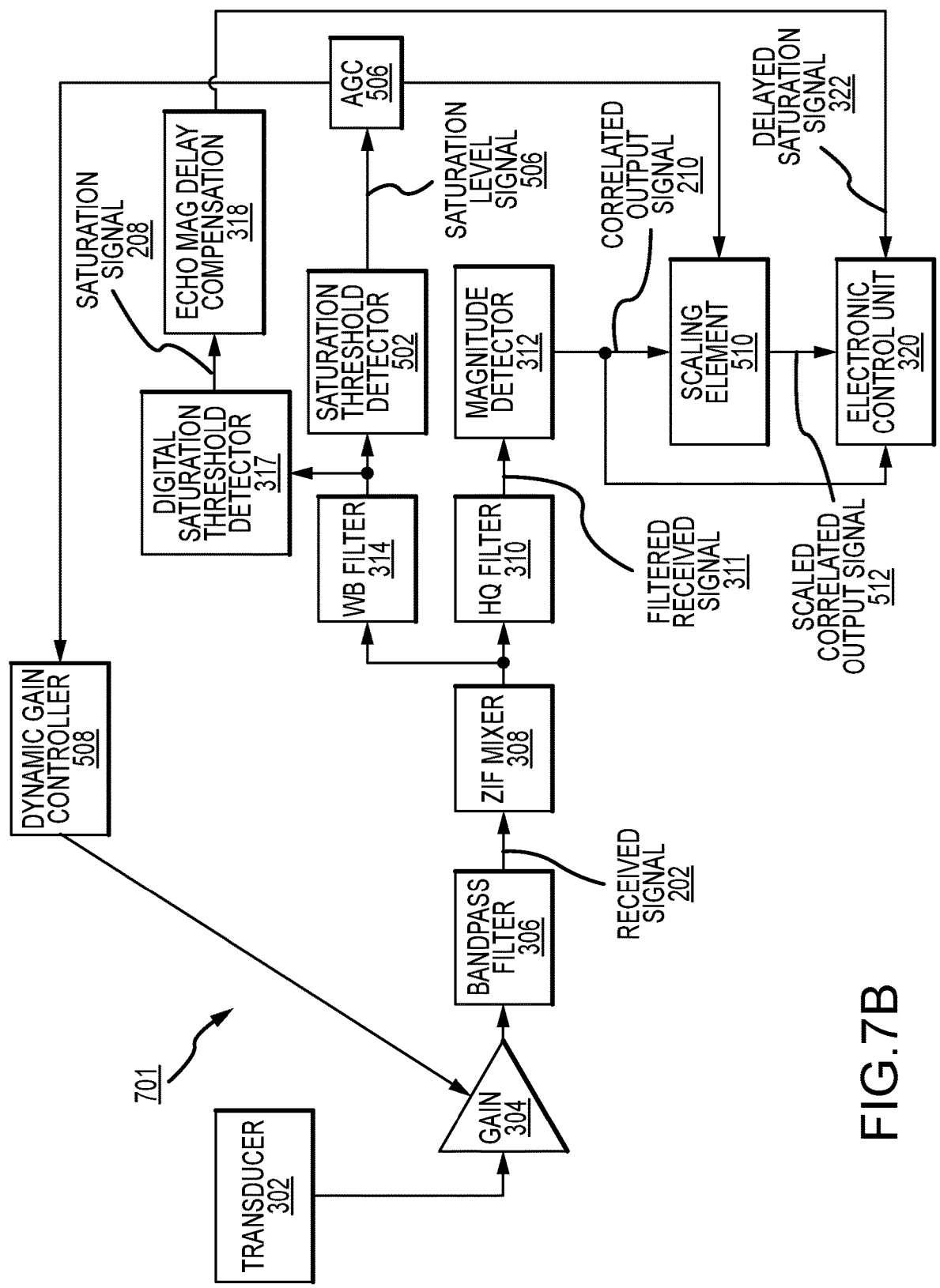
FIG. 7B is a schematic diagram of a second circuit for use, in the digital domain, which combines features of the circuit of FIGS. 3B and 5B, and in accordance with at least one embodiment of the present disclosure.

In accordance with at least one embodiment of the present disclosure and in accordance with the embodiments of FIGS. 7A and 7B, a process for detecting saturation of echo signals may include detecting when a received signal is saturated, delaying communication of a saturation signal to an ECU to correspond with a providing of a correlated output signal to the ECU, dynamically adjusting a gain level used for the receiving transponder until the received signal is no longer saturated and applying an inverse gain adjustment to a correlated output signal provided to an ECU, such that echoes present in the received signal at a lower gain setting are not saturated and are detectable and processed by the ECU while fake echoes present in the received signal at higher, saturated gain settings are disregarded and not processed by the ECU and further providing the ECU with sufficient information indicate a sensor is blind.

It is to be appreciated that the operations described above are illustrative only and are not intended herein to occur, for all embodiments of the present disclosure, in the order described, in sequence, or otherwise. One or more operations may be performed in parallel and operations may be not performed, as provided for any given use of an embodiment of the present disclosure.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "next", "last", "before", "after", and other similar terms are used for description and ease of reference purposes only and are not intended to be limiting to any orientation or configuration of any elements or sequences of operations for the various embodiments of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

What is claimed is:

1. A process, for detecting saturation of a received signal, comprising:
    detecting, in a received signal and during a measurement interval, one or more correlated signal levels;
    based on one or more results of the detecting,
        identifying, in a correlated output signal, portions of the received signal which exceed a given magnitude threshold during the measurement interval;
        providing the correlated output signal to an electronic control unit (ECU);
            wherein the correlated output signal is output by a magnitude detector;
    determining, by a saturation detector, whether the received signal is saturated during one or more portions of the measurement interval;
        when the received signal is saturated,
            generating a saturation signal; and
    delaying the saturation signal to generate a delayed saturation signal; and
    providing the delayed saturation signal to the ECU substantially contemporaneously with the providing of the correlated output signal to the ECU.

2. The process of claim 1,
    wherein the portions of the received signal which exceed the given magnitude threshold and identified in the correlated output signal are indicative of at least one of a real echo and a fake echo; and
    wherein real echoes are used by a PAS system to detect obstacles.

3. The process of claim 1,
    wherein and while the delayed saturation signal indicates saturation of the received signal,
        interpreting, by the ECU, at least one portion of the correlated output signal received substantially contemporaneously with the delayed saturation signal as including at least one of:
            a real echo;
            a real echo followed by one or more fake echoes; and
            one or more fake echoes.

4. The process of claim 3,
    wherein the ECU interprets the correlated output signal as including one or more fake echoes when the delayed saturation signal indicates repeated saturation of the received signal during the measurement interval.

5. The process of claim 4,
    wherein repeated saturation of the received signal during the measurement interval is determined to occur, by the ECU, when the delayed saturation signal indicates a programmable number of portions of the correlated output signal are saturated during the measurement interval.

6. The process of claim 1, further comprising:
    determining by a saturation threshold detector, during the measurement interval, whether the received signal exceeds a given saturation level;
    when the received signal exceeds the given saturation level,
        dynamically adjusting a gain level of a gain stage used while processing the received signal;
        adjusting, by a scaling element, the correlated output signal based upon the dynamically adjusting of the gain level of the gain stage; and
        providing to the ECU a scaled correlated output signal.

7. The process of claim 6, further comprising:
    determining, by the ECU, whether to at least one of:
        use the correlated output signal to identify an obstacle;

use the scaled correlated output signal to identify an obstacle; and designate a PAS system as being blind during a given measurement interval.

8. The process of claim 7, wherein, during a first given measurement interval, the ECU designates the PAS system as being blind when a repeated saturation of the received signal indicates a programmable number of portions of the correlated output signal are saturated.

9. The process of claim 8, wherein, during a second given measurement interval, the ECU designates the PAS system as being blind when the delayed saturation signal indicates the received signal is saturated during a given portion of the received signal and the correlated output signal does not indicate that the given portion of the received signal exceeds the given magnitude threshold.

10. The process of claim 8, wherein, during the first given measurement interval, an in-band noise saturates the received signal; and wherein, during a second given measurement interval, an out-of-band noise saturates the received signal.

11. The process of claim 10, wherein the in-band noise arises from a motor vehicle airbrake.

12. The process of claim 10, wherein a HQ filter receives the received signal, filters any out-of-band noise signal influenced portions out of the received signal, and outputs a filtered received signal; and wherein the correlated output signal generated by the magnitude detector from the filtered received signal does not identify any portion of the received signal as exceeding the given magnitude threshold during the measurement interval.

13. A system comprising:

a transducer configured to emit a ranging signal and receive a received signal during a measurement interval;

wherein, when an obstacle is within a given distance of the transducer, the received signal includes an echo of the ranging signal reflected off the obstacle;

a gain stage, coupled to the transducer, configured to increase a received signal strength of the received signal;

at least one of a saturation detector and a saturation threshold detector;

wherein each of the saturation detector and the saturation threshold detector are coupled to the gain stage;

wherein the saturation detector is configured to detect saturation of the received signal during one or more portions of the measurement interval;

wherein the saturation threshold detector is configured to determine a saturation threshold for the received signal;

a digital filter, coupled to the gain stage, configured to convert the received signal into a filtered received signal; and a magnitude detector, coupled to the digital filter, configured to:

detect, during the measurement interval, one or more portions of the filtered received signal which exceed a given threshold and are each a potential echo; and based on such detecting, output a correlated received signal indicative thereof.

14. The system of claim 13, further comprising:

a delay element, coupled to the saturation detector;

wherein the saturation detector outputs a saturation signal; and wherein the delay element receives the saturation signal, and after a predetermined delay period, outputs a delayed saturation signal indicative of the one or more portions of the received signal, during the measurement interval, that are received at a saturated level; and wherein the predetermined delay period corresponds to a processing delay for the digital filter.

15. The system of claim 14, wherein, when the received signal includes out-of-band noise during the measurement interval, the correlated received signal does not indicate a presence of any echoes within the received signal.

16. The system of claim 15, further comprising:

an electronic control unit (ECU) which receives each of the correlated received signal and the delayed saturation signal;

wherein, the ECU is configured to at least one of:

disregard at least one second echo identified in the correlated received signal when:

a presence of a first echo identified in the correlated received signal occurs substantially contemporaneously with an indication, in the delayed saturation signal, that the received signal is saturated during the first echo; and the at least one second echo arises within a given period of the first echo in the measurement interval;

disregard two or more echoes when the delayed saturation signal indicates the received signal is saturated for more than a given portion of the measurement interval;

designate the system as being blind when the correlated received signal provides no indication of any echoes detected within the received signal while the delayed saturation signal indicates that the received signal is saturated during the measurement interval.

17. The system of claim 13, wherein the gain stage is adjustable to one or more gain settings;

wherein at least one first gain setting is used for detecting near-range obstacles; and wherein at least one second gain setting is used for detecting mid-range obstacles; and wherein at least one third gain setting is used for detecting long-range obstacles.

18. The system of claim 17, further comprising:

wherein the saturation threshold detector is configured to output a saturation level signal indicative of a saturation level of the received signal during a given portion of the measurement interval;

a dynamic gain stage, coupled to the saturation threshold detector and the gain stage, configured to adjust the gain stage between one or more of a gain setting of the at least one first gain setting, a gain setting of the at least one second gain setting, and a gain setting of the at least one third gain setting;

wherein, the dynamic gain stage is configured to adjust the gain stage such that the saturation level of the received signal remains below a determined saturation threshold; and a scaling element, coupled to the magnitude detector, configured to scale the correlated received signal based upon adjustments by the dynamic gain stage to the gain stage.

19. The system of claim 18,
wherein the determined saturation threshold is maintained, by the dynamic gain stage, at less or equal to a programmable level.

20. The system of claim 13,
wherein each of the saturation detector and the saturation threshold detector operate in either an analog domain or a digital domain.

* * * * *